United States Patent [19]
Koh

[11] Patent Number: 5,464,782
[45] Date of Patent: Nov. 7, 1995

[54] METHOD TO ENSURE ISOLATION BETWEEN SOURCE-DRAIN AND GATE ELECTRODE USING SELF ALIGNED SILICIDATION

[75] Inventor: Chao-Ming Koh, Hsin-chu, Taiwan

[73] Assignee: Industrial Technology Research Institute, Hsinchu, Taiwan

[21] Appl. No.: 270,765

[22] Filed: Jul. 5, 1994

[51] Int. Cl.⁶ ............... H01L 21/265; H01L 21/44; H01L 21/48
[52] U.S. Cl. ............... 437/41; 437/45; 437/192; 437/200
[58] Field of Search ............... 437/45, 41, 40, 437/36, 913, 200, 203, 192

[56] References Cited

U.S. PATENT DOCUMENTS

| | | | |
|---|---|---|---|
| 4,330,931 | 5/1982 | Lin | 437/41 |
| 4,419,810 | 12/1983 | Riseman | 437/41 |
| 4,746,377 | 5/1988 | Kobayashi et al. | 437/40 |
| 4,978,629 | 12/1990 | Komori et al. | 437/41 |
| 4,992,388 | 2/1991 | Pfiester | 437/41 |
| 5,089,432 | 2/1992 | Yoo | 437/40 |
| 5,175,118 | 12/1992 | Yoneda | 437/41 |
| 5,196,357 | 3/1993 | Boardman et al. | 437/41 |
| 5,231,038 | 7/1993 | Yamaguchi et al. | 437/45 |
| 5,270,232 | 12/1993 | Kimura et al. | 437/41 |
| 5,270,256 | 12/1993 | Bost et al. | 437/195 |
| 5,330,923 | 7/1994 | Kusunoki et al. | 437/40 |

*Primary Examiner*—Olik Chaudhuri
*Assistant Examiner*—Brian K. Dutton
*Attorney, Agent, or Firm*—George O. Saile

[57] ABSTRACT

A method for fabricating MOSFET devices with shallow source and drain diffusions, and high yielding self aligned refractory metal silicides was accomplished. This method involves forming a source and drain polysilicon diffusion layer, opening an hole in the polysilicon for the gate region, and fabricating oxide sidewalls in the hole to isolate the source and drain from a polysilicon gate. A polysilicon gate is than formed with a shape that will not allow the sides of this gate to experience subsequent metal deposition. A low temperature silicidation process than results in an absence of source and drain to gate polysilicon shorting or bridging, due to this unique gate polysilicon shape.

19 Claims, 4 Drawing Sheets

5,464,782

METHOD TO ENSURE ISOLATION BETWEEN SOURCE-DRAIN AND GATE ELECTRODE USING SELF ALIGNED SILICIDATION

BACKGROUND OF THE INVENTION (1) Field of the Invention

The present invention relates to a process in which Metal Oxide Silicon Field Effect Transistors, (MOSFET), devices are fabricated using specific semiconductor fabrication techniques to improve yield and performance.

(2) Description of Prior Art

Very large scale integration (VLSI) technologies have helped the electronic chip industry reduce cost while still increasing chip and circuit performance. Further improvements in cost and performance strongly depends on the ability of the semiconductor process community to either continue to decrease chip size or use less resistive films.

The advances in lithograhy, such as more advanced cameras, or more sensitive photoresist materials, have allowed important features of semiconductor chips to decrease in size thus improving density as well as performance. The reduction in gate electrode dimensions have resulted in narrower channel lengths of FET devices, thus improving performance. However the narrower polysilicon gates are less conductive than their wider counterparts thus a decrease in performance can result. One method to overcome the resistive aspect of narrower polysilicon gates is via the use of silicided polysilicon gates.

There are several methods for preparing silicided polysilicon gates. One can deposit, either via chemical vapor deposition, (CVD), or vacuum processes, a silicide, such as titanium silicide, ($TiSi_2$), on a blanket polysilicon layer and use standard lithograhy and RIE processes to define a silicide/polysilicon gate. U.S. Pat. No. 5,089,432, by Yoo, shows this process. The use of this technique does not allow the source and drain regions to benefit from this process, since these regions are defined after the polysilicon gates have been formed. A method that does allow both the polysilicon gate as well as the source and drains to be silicided is a self-aligned process, usually referred to as salicide.

The salicide process is accomplished by depositing a metal, such as titanium, (Ti), on the patterned gate and source-drain. The polysilicon gate had previously been subjected to an insulator/reactive ion etching, (RIE), process to create a insulator sidewall which is needed for this salicide process. When these structures are subjected to an anneal step, $TiSi_2$ will form only on the exposed silicon regions, such as the top of the polysilicon gate and the source-drain areas. Ti will remain unreacted on non silicon regions, such as the polysilicon insulator sidewall. A selective etch is than used to remove the unreacted Ti, not significantly attacking the $TiSi_2$, and thus arriving at low resistance silicided gates and source-drains, isolated by the polysilicon insulator sidewall.

One yield detractor associated with the self aligned process is bridging between the polysilicon gate and the source-drain. This arises from either Ti not being removed by the selective etchant, or somehow the anneal process created $TiSi_2$ on the sidewall and thus the etchant was ineffective. Thus the semiconductor industry is still investigating process sequences that would reduce or eliminate the bridging phenomena.

SUMMARY OF THE INVENTION

It is an object of the present invention to provide a shallow junction FET device in which the source and drain of this device is formed by diffusion from an overlying doped polysilicon layer.

It is another object of this invention to self align the poly silicon gate to an already fabricated source and drain region.

It is still another object of this invention to create a polysilicon gate shape, wider at the top than the bottom, that will subsequently result in shadowing of metal depositions.

And still a further object of this invention is to form a self aligned silicide, on the polysilicon gate as well as the source and drains, with reduced risk of gate/substrate shorts due to bridging.

In accordance with this present invention, a method is described for fabricating a MOSFET device by forming a field oxide pattern and an anti-punch thru region on a silicon substrate. Depositing a polysilicon layer on the field oxide and the exposed silicon substrate and than depositing a silicon nitride layer over the polysilicon layer. Openings thru the silicon nitride and polysilicon layers are made to the substrate and a threshold adjust ion implant, (I/I), is performed. A spacer oxide is than fabricated on the sidewall of the opening followed by a gate oxidation of the exposed silicon substrate in the opening. A second polysilicon layer is deposited over the silicon nitride layer and the gate oxide. The second polysilicon layer is patterned to overlap the opening in the silicon nitride-first polysilicon layers and thus after complete removal of the silicon nitride layer, the second polysilicon overhangs the first polysilicon layer. Ion implantation is performed to dope the polysilcon gate electrode, (second polysilicon), as well as the first polysilicon layer which after an anneal results in formation of the source-drain regions in the substrate. Titanium is than deposited on all regions except under the overhang. After an anneal to form the metal silicide on the regions where Ti interfaced silicon, not insulator, removal of the unreacted Ti is performed in a selective etchant. After an additional anneal to reduce the resistivity of the silicide an insulator is deposited and holes opened to the polysilicon gate and the source-drain regions. Metallization and subsequent patterning is performed to contact the gate polysilicon and the source-drain regions.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

The method for forming the self aligned silicide is now covered in detail. This self aligned polysilicon gate silicide can be used on MOSFET structures that are currently being manufactured in industry, therefore only the specific areas unique to understanding this invention will be described in detail.

Figure 1:
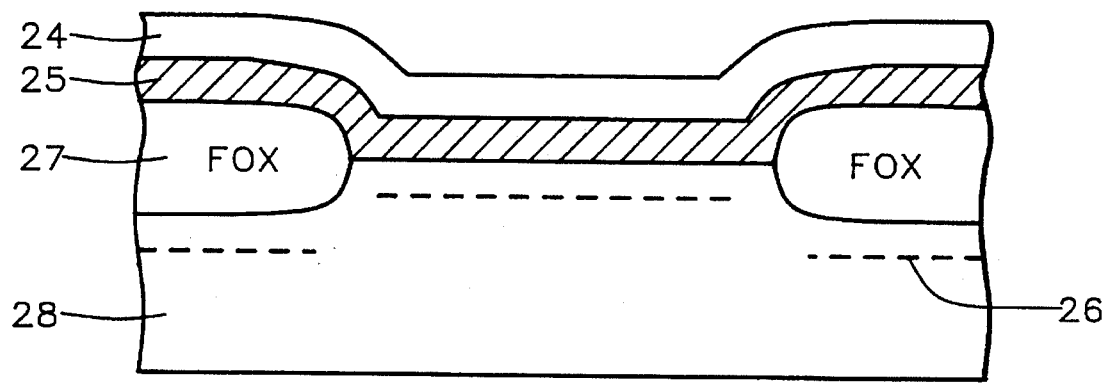
FIG. 1-7 which schematically illustrate the cross-section representation of key fabrication stages. The figures follow the process flow in the preferred embodiment for making the self aligned MOSFET device.

Referring now to FIG. 1, a cross-sectional view of the substrate 28, is shown. The preferred substrate is composed of P type single crystal silicon with a <100> crystallographic orientation. A thick field oxide 27 (FOX), for isolating the device, is first formed surrounding the region where the device is to be built. Briefly, the method commonly practiced in the industry is to use a thin thermal oxide (pad oxide) and a silicon nitride layer as an oxidation mask. The desired field oxide regions are etched open in the oxide/nitride layer using conventional photolithographic techniques. A field oxide is than grown, typically to a thickness of about 4000 to 6000 angstroms.

After removal of the nitride/oxide layer, via use of a heated solution of phosphoric acid, $H_3PO_4$, for the nitride, and a buffered or dilute HF solution for the oxide, the silicon surface is carefully cleaned. A field and antipunch thru ion implantation (I/I) is now performed, using $B^{11}$ at an energy between about 50 to 180 Kev and a dose between 1E12 to 4E12 atoms/cm2. These dopants are shown as region 26 in FIG. 1. Again after cleaning the surface to remove any native oxide, a polysilicon layer 25 is deposited using a low pressure chemical vapor deposition, (LPCVD). The thickness used is usually in the range from 500 to 1000 angstroms. A LPCVD silicon nitride, $Si_3N_4$, layer 24 is than deposited onto the polysilicon layer. The thickness of the nitride layer can be 500 to 1000 angstroms.

Figure 2:
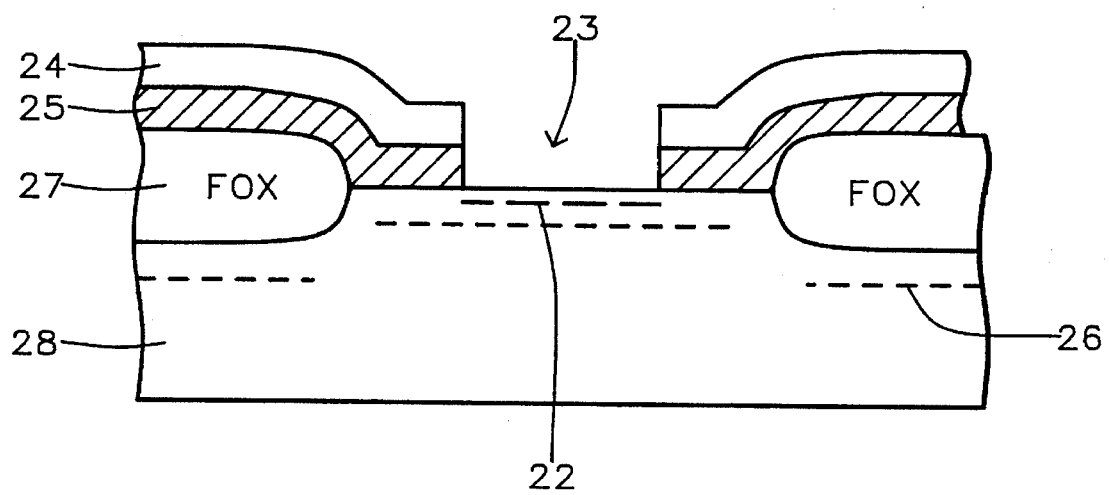

The patterning process for the source and drain (s/d) is shown in FIG. 2. Conventional photolithographic techniques, along with RIE processing are used to form image 23. The nitride and polysilicon can be dry etched using RIE reactants such as $Cl_2+HBr$ and $SF_6+O_2$. Care has to be taken not to remove much single crystal silicon at the completion of the polysilicon portion of the RIE process. Another method used is to define the desired pattern in the nitride using RIE, than remove the defining photoresist. An oxidation is than performed between about 875° to 950° C., to a thickness of about 1150 to 2300 angstroms, to consume all the exposed polysilicon in hole 23. Next a dilute HF is used to remove the reoxidized polysilicon. In both cases the hole 23 for the s/d has been formed.

Figure 3:
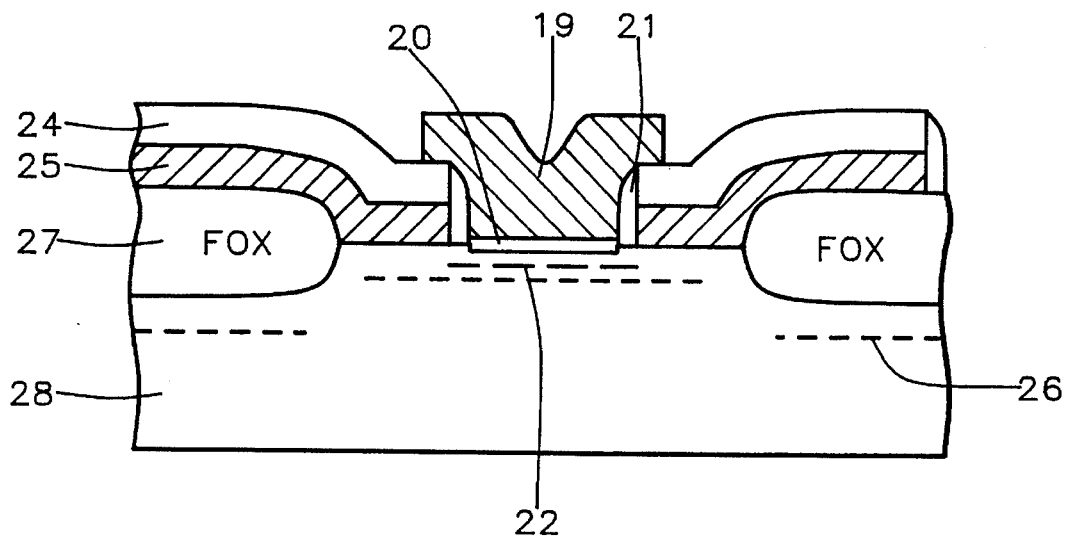

An oxide spacer 21, shown in FIG. 3, is formed along the sides of hole 23, to subsequently isolate the s/d regions from a soon to be formed polysilicon gate. The spacer is formed by LPCVD of SiO2 to a thickness of 1000 to 1500 angstroms. An anisotropic RIE step, using $CHF_3+Ar$, is performed to remove the LPCVD oxide, except on the sides of hole 23, forming spacer 21. The anisotropic etch also exhibits high selectivity, that is removing $SiO_2$ at a much greater rate than silicon removal.

The composition of layer 21 and layer 24 can be interchanged to have layer 21 be $Si_3N_4$, while layer 24 can be $SiO_2$. Of course the etching steps would also be changed accordingly. Again after a carefully cleaned surface a channel I/I is used to obtain a desired threshold voltage. This implant is performed using $BF_2$ at an energy between 30 to 60 Kev, and a dose of between 5E11 to 2E12 atoms/cm$^2$, and shown as region 22 in FIG. 3.

After a wet chemical cleaning of the silicon surface a good quality thermal oxide is grown to form the gate oxide 20. The preferred thickness is about 80 to 140 angstroms, grown in a O2 ambient, between 800° to 900° C. Next the gate polysilicon structure is formed by first depositing a polysilicon layer, for example using LPCVD to a thickness of about 1500 to 3000 angstroms.

Conventional photolithographic techniques are than used to define the desired gate pattern in photoresist. The polysilicon gate width is greater than the width of hole 23. An anisotropic RIE step is performed using $Cl_2+HBr$ to obtain the polysilicon gate structure 19.

Figure 4:
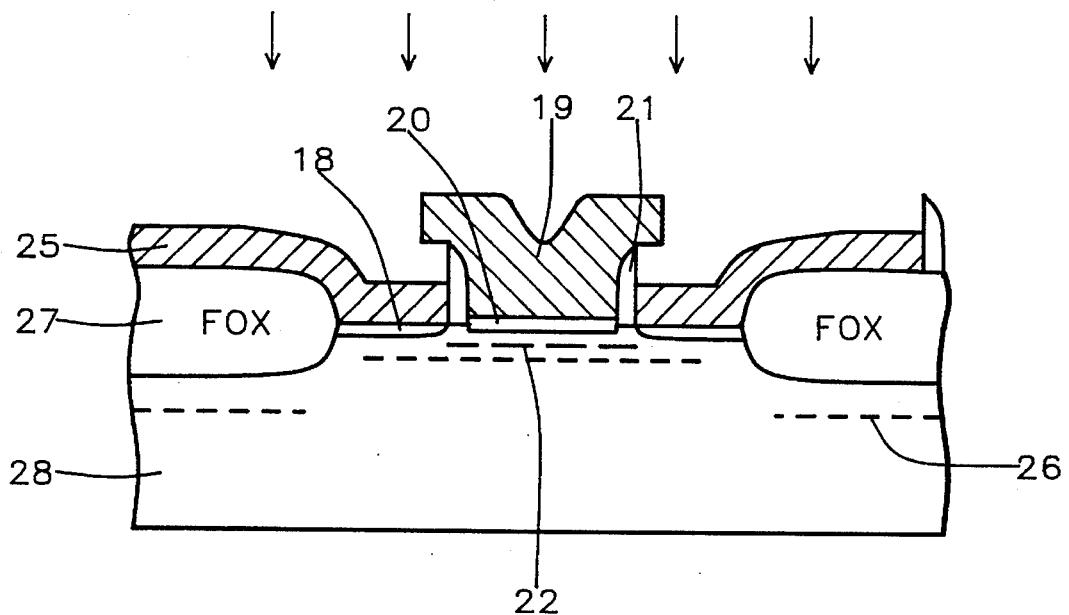

A wet chemical etch is now used to remove $Si_3N_4$, layer 24. This is accomplished using $H_3PO_4$ at a temperature between 150° to 165° C. (If layer 24 is $SiO_2$ a bufferd HF etchant is used). An I/I is now used to dope both the polysilicon gate, as well as the polysilicon which will be the doping source for the subsequent s/d. This is schematically shown in FIG. 4. The I/I is accomplished using arsenic, (As), or phosphorus, (P), at an energy between about 30 to 50 Kev and a dose of 1E15 to 5E15 atoms/cm2. A s/d drive-in, performed in a conventional furnace or a rapid thermal anneal (RTA) tool, at a temperature of about 850° to 900° C., in $N_2$, Ar, for 10 to 30 min. for conventional furnace, (or 950° to 1000° C., in $N_2$, Ar, for 10 to 30 sec. for the RTA process), results in the outdiffusion of As, or P from polysilicon 25, into the single crystal silicon, forming s/d regions 18.

Figure 5:
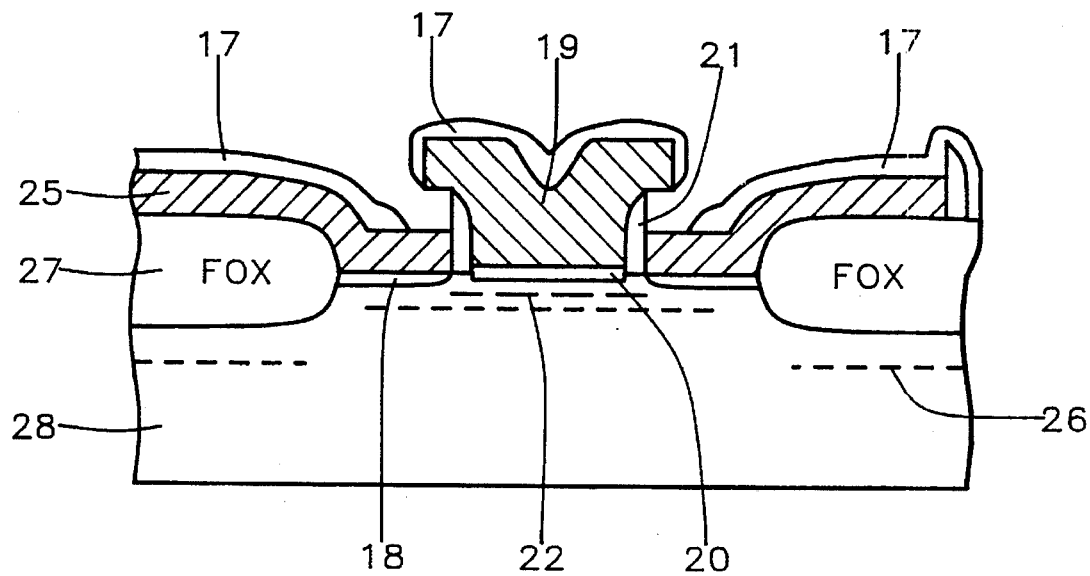

After cleaning the structure, a silicide forming metal, for example titanium, (Ti), tungsten, (W), tantalum, (Ta), cobalt, (Co), or the like, is deposited via sputtering or evaporation to a thickness of about 200 to 500 angstroms, shown in FIG. 5 as layer 17. The previous processing was performed to intentionally produce a polysilicon gate structure with the negative angle or the overhang. Thus the metal deposition results in an intentional, and desired discontinous film.

Figure 6:
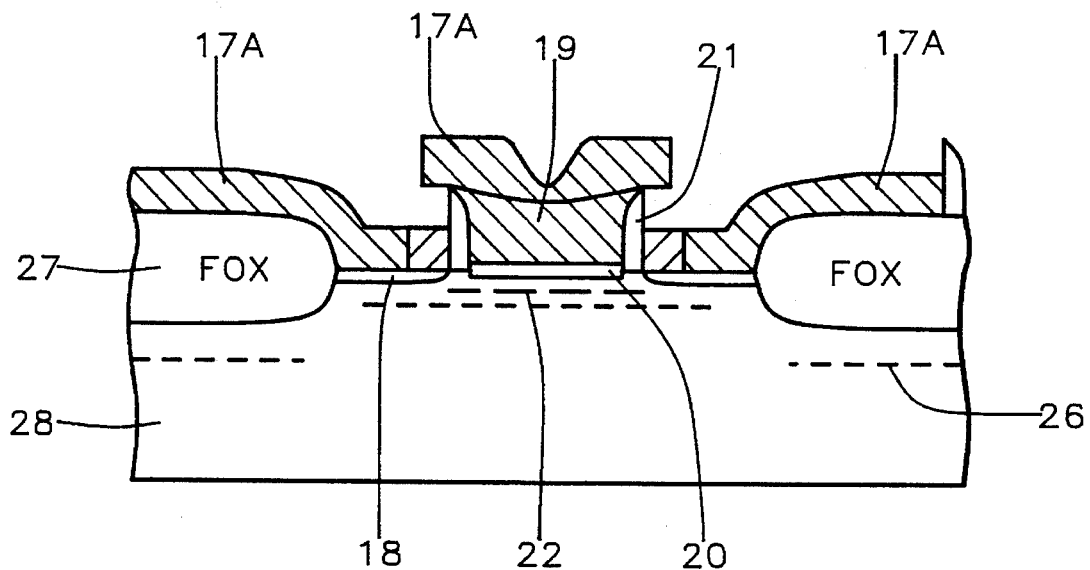

FIG. 6 shows the result of a two step silicidation process. First an anneal is performed at 600°–700° C. to form a specific $TiSi_2$ film, 17A, from areas where Ti is interfacing silicon, such as the s/d and gate polysilicon surfaces. Where Ti is on insulator, such as the spacer oxide 21, and the field oxide 27, the Ti remains unreacted. This anneal step can be accomplished using conventional furnace processing or via RTA. Next a wet chemical strip is used to selectively remove the unreacted Ti from the structure. This is accomplished using a 1:1:5 composition of $NH_4OH: H_2O_2: H_2O$ at a temperature between about 25° to 40° C. Finally an additional anneal is performed, again in a conventional or RTA furnace at a temperature of about 800° C., using 30 to 60 sec. for the RTA process. This is performed to further reduce the resistivity of the $TiSi_2$ film.

Figure 7:
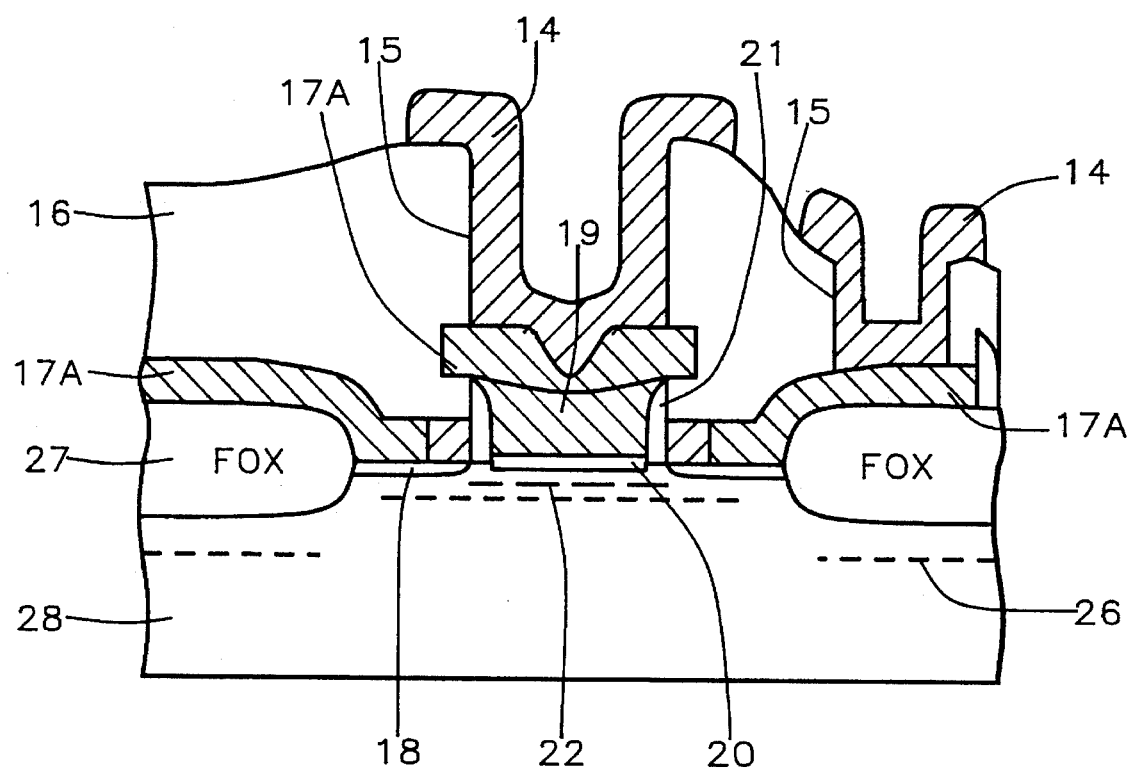

A oxide, 16, is now deposited using LPCVD at 400° to 600° C., or a lower temperature plasma enhanced process (PECVD) at 400° C., to a thickness of 6000 to 9000 angstroms. Standard photolithographic techniques are used again, along with a RIE process, using $CHF_3+Ar$, to produce the contact holes, 15, to the polysilicon gate 19, as well as to the polysilicon source-drain extensions 25. This is schematically shown in FIG. 7. Metal is deposited using either PECVD, LPCVD, evaporation or sputtering. The metallurgy can be Ti under aluminum at a thickness of 1000 and 6000 angstroms, respectively. Standard photolithographic and metal RIE processing is performed to result in metal contacts 14. The RIE processing can be accomplished using $Cl_2$.

It should be noted that this invention, self aligned silicidation, although shown as part of a NFET device, can be used for fabrication of PFET, CMOS, or BiCMOS devices.

While this invention has been particularly shown and described with reference to the preferred embodiments thereof, it will be understood by those skilled in the art that various changes in form and details may be made without departing from the spirit and scope of this invention.

What is claimed is:

1. The method for fabricating a MOSFET device on a semiconductor having device regions formed therein comprising:

forming a field oxide pattern for isolation of device regions on the surface of said substrate;

ion implanting a first conductivity imparting dopant for anti-punch thru protection;

depositing a first polysilicon layer over said substrate and said field oxide pattern;

depositing a first dielectric layer over said first polysilicon layer;

patterning to form openings through said first dielectric layer and said first polysilicon layer to said device regions;

depositing a second dielectric layer;

anisotropically etching said second dielectric layer to form spacer insulator on the sides of said openings;

ion implanting a second conductivity imparting dopant into said openings into said device regions;

growing a gate oxide on said device region in said openings;

depositing a second polysilicon layer over said first dielectric layer and said gate oxide;

patterning of said second polysilicon layer, to form a polysilicon gate structure completely covering said device region, said spacer insulator and partially overlapping said first polysilicon layer, thus creating an overhang;

etching completely said first dielectric layer to expose said first polysilicon layer and some of said spacer insulator;

ion implanting a third conductivity imparting dopant into said polysilicon gate structure and into said first polysilicon layer annealing to drive said third conductivity imparting dopant from said first polysilicon layer into said substrate forming source-drain regions;

depositing a metal film on all exposed areas, said first polysilicon layer and said polysilicon gate structure but not regions protected by said overhang;

annealing to form metal silicide from said first polysilicon layer and said polysilicon gate structure;

removal of unreacted said metal;

depositing an insulator film on exposed said metal silicide layers;

patterning to form second openings in said insulator film to said metal silicide, formed from said polysilicon gate structure, and said metal silicide, formed from said first polysilicon layer; depositing a second metal film on said insulator film;

patterning to form metal contacts to said metal silicide, formed from said polysilicon gate structure and said metal silicide, formed from said first polysilicon layer.

2. The method of claim 1 wherein said first dielectric layer is silicon nitride and said second dielectric layer is silicon oxide.

3. The method of claim 1 wherein said first dielectric layer is silicon oxide and said second dielectric layer is silicon nitride.

4. The method of claim 1, wherein said first conductivity imparting dopant is boron 11, and is ion implanted at an energy between about 150 to 240 Kev., at a dose between about 3E12 to 1E13 atoms/cm2.

5. The method of claim 1 wherein said first polysilicon layer is formed by low pressure chemical vapor deposition at a temperature between about 570° to 620° C., formed to a thickness from 500 to 1000 angstroms.

6. The method of claim 1, wherein said first dielectric layer is formed from low pressure chemical vapor deposition at a temperature between about 680° to 720° C., to a thickness from 500 to 1000 angstroms.

7. The method of claim 1, wherein said openings in said first dielectric layer and said first polysilicon layers are formed using photoresist masking and anisotropic etching.

8. The method of claim 1, wherein said second conductivity imparting dopant is $BF_2$ and is ion implanted at an energy between about 30 to 60 Kev at a dose of between about 5E11 to 2E12 atoms/cm$^2$.

9. The method of claim 1, wherein said spacer insulator is grown by chemical vapor deposition at a temperature between about 600° to 700° C., to a thickness between about 1000 to 1500 Angstroms and formed by anisotropic reactive ion etching using CHF3 and Ar.

10. The method of claim 1, wherein said second polysilicon layer is formed by low temperature chemical vapor deposition at a temperature between about 570° to 620° C., having a thickness of 1500 to 3000 Angstroms.

11. The method of claim 1, wherein said polysilicon gate structure is formed using photoresist masking and anisotropic etching of said second polysilicon layer using $Cl_2$+HBr.

12. The method of claim 1, wherein said first dielectric layer is completely removed by isotropic etching using phosphoric acid at a temperature of between about 150° to 165° C.

13. The method of claim 1, wherein said first polysilicon layer and said polysilicon gate structure are doped by ion implanting a third conductivity imparting dopant, arsenic, at an energy between about 30 to 50 Kev., at a dose between about 1E15 to 5E15 atoms/cm2.

14. The method of claim 1, wherein said metal film is deposited to a thickness of 200 to 500 Angstroms.

15. The method of claim 1, wherein said metal film is titanium.

16. The method of claim 1, wherein titanium silicide is formed on said first polysilicon layer and said polysilicon gate structure by conventional furnace annealing at a temperature between about 850° to 900° C.

17. The method of claim 1, wherein titanium silicide is formed on said first polysilicon layer and said polysilicon gate structure by rapid thermal annealing at a temperature between about 950° to 1000° C.

18. The method of claim 1, wherein removal of said metal film is by isotropic etching at a temperature between about 25° to 40° C., using $NH_4OH+H_2O_2+H_2O$.

19. The method of claim 1, wherein said annealing of said metal silicide, formed from said first polysilicon layer, and said metal silicide, formed from polysilicon gate structure, is performed at a temperature between about 800° to 850° C., to further reduce the resistance.

\* \* \* \* \*